(12) United States Patent
Ishii et al.

(10) Patent No.: US 9,507,253 B2
(45) Date of Patent: Nov. 29, 2016

(54) MASK PATTERN GENERATING METHOD, RECORDING MEDIUM, AND INFORMATION PROCESSING APPARATUS

(71) Applicant: CANON KABUSHIKI KAISHA, Tokyo (JP)

(72) Inventors: Hiroyuki Ishii, Shioya-gun (JP); Kenji Yamazoe, Brookline, MA (US)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/297,345

(22) Filed: Jun. 5, 2014

(65) Prior Publication Data

US 2014/0365985 A1 Dec. 11, 2014

(30) Foreign Application Priority Data

Jun. 11, 2013 (JP) ................................. 2013-123218

(51) Int. Cl.
*G06F 17/50* (2006.01)
*G03F 1/70* (2012.01)
*G06T 7/00* (2006.01)
*G03F 1/36* (2012.01)

(52) U.S. Cl.
CPC . *G03F 1/70* (2013.01); *G03F 1/36* (2013.01); *G06F 17/50* (2013.01); *G06F 17/5068* (2013.01); *G06T 7/001* (2013.01)

(58) Field of Classification Search
CPC ........... G06T 7/001; G03F 1/70; G03F 1/36; G06F 17/50; G06F 17/5065
USPC ............................ 716/51, 53, 55, 139; 430/5
See application file for complete search history.

(56) References Cited

U.S. PATENT DOCUMENTS

| | | | | |
|---|---|---|---|---|
| 6,605,478 B2* | 8/2003 | Pnueli | ..................... | H01L 22/20 257/E21.525 |
| 8,247,141 B2* | 8/2012 | Higaki | ..................... | G03F 1/144 430/5 |
| 8,352,892 B2* | 1/2013 | Hakko | ..................... | G03F 1/36 430/30 |
| 2002/0142522 A1* | 10/2002 | Pnueli | ..................... | H01L 22/20 438/140 |
| 2008/0052334 A1* | 2/2008 | Yamazoe | ................ | G03F 1/144 708/191 |
| 2008/0070131 A1* | 3/2008 | Yamazoe | ................ | G03F 1/144 430/5 |
| 2009/0027650 A1* | 1/2009 | Yamazoe | ................ | G03F 1/36 355/77 |

(Continued)

FOREIGN PATENT DOCUMENTS

| | | |
|---|---|---|
| CN | 1573554 A | 2/2005 |
| CN | 101681093 A | 3/2010 |

(Continued)

*Primary Examiner* — Helen Rossoshek
(74) *Attorney, Agent, or Firm* — Canon USA, Inc. IP Division

(57) ABSTRACT

A method for generating a pattern of a mask used for an exposure apparatus through a calculation by a processor includes applying, to a target main pattern, a reference map of a characteristic value of an image of a representative main pattern with respect to a position of a representative auxiliary pattern calculated for each of a plurality of positions while the position of the representative auxiliary pattern with respect to the representative main pattern is changed and calculating a map of the characteristic value of the image of the target main pattern with respect to a position of an auxiliary pattern, and determining the position of the auxiliary pattern by using data of the map of the characteristic value of the image of the target main pattern and generating a pattern of a mask including the target main pattern and the determined auxiliary pattern.

11 Claims, 12 Drawing Sheets

(56) References Cited

U.S. PATENT DOCUMENTS

| | | | |
|---|---|---|---|
| 2010/0180252 A1* | 7/2010 | Kawashima | G03F 1/144 716/53 |
| 2010/0183959 A1* | 7/2010 | Higaki | G03F 1/144 430/5 |
| 2011/0065028 A1* | 3/2011 | Kodera | G03F 1/36 430/5 |
| 2011/0207247 A1* | 8/2011 | Hwang | G03F 7/70633 438/14 |
| 2012/0009509 A1* | 1/2012 | Hakko | G03F 1/36 430/5 |
| 2012/0107730 A1* | 5/2012 | Ishii | G03F 1/36 430/5 |
| 2013/0088696 A1* | 4/2013 | Miyazaki | G03F 7/70641 355/55 |
| 2013/0246982 A1* | 9/2013 | Arai | G03F 1/36 716/53 |

FOREIGN PATENT DOCUMENTS

| | | |
|---|---|---|
| JP | 2004-221594 A | 8/2004 |
| JP | 2008-040470 A | 2/2008 |
| JP | 2011-150333 A | 8/2011 |
| JP | 2012-018327 A | 1/2012 |
| TW | 200734828 A | 9/2007 |
| TW | 200931290 A | 7/2009 |

* cited by examiner

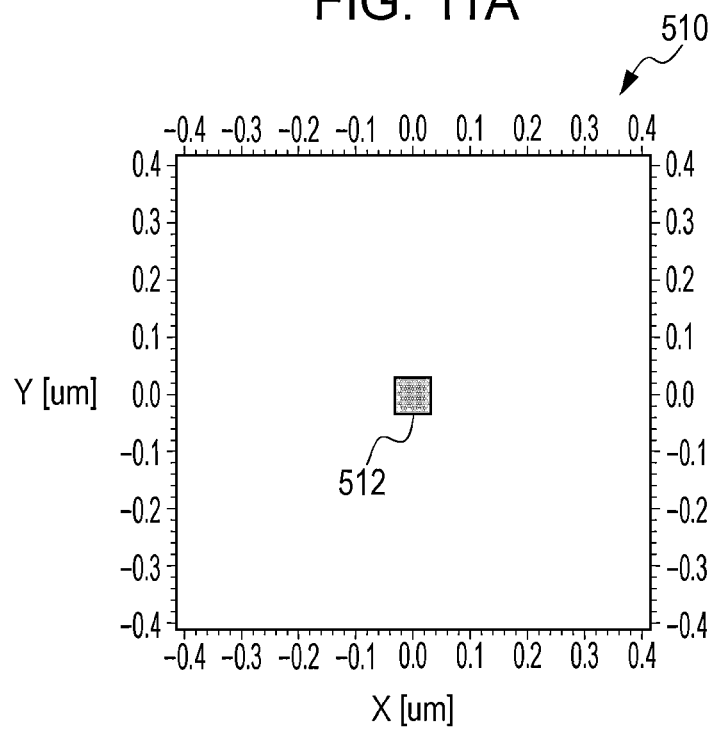
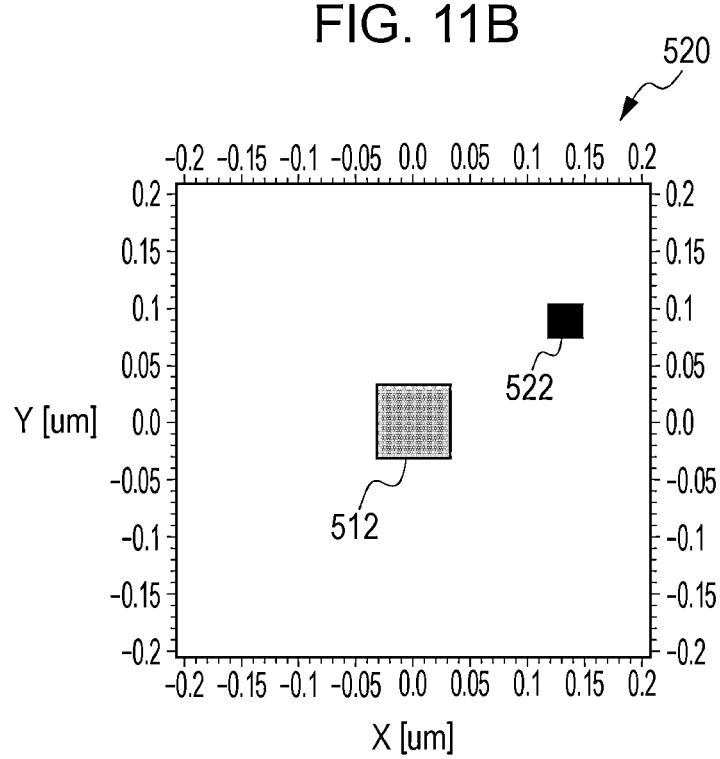

MASK PATTERN GENERATING METHOD, RECORDING MEDIUM, AND INFORMATION PROCESSING APPARATUS

BACKGROUND OF THE INVENTION

1. Field of the Invention

The present invention relates to a mask pattern generating method, a recording medium, and an information processing apparatus.

2. Description of the Related Art

In recent years, a miniaturization of a mask pattern for a semiconductor device has been advanced, and it is being difficult to perform an image dissection of the mask pattern by a projection exposure apparatus. A technique with which a small auxiliary pattern that is not subjected to the image dissection is added to the mask pattern is proposed as a technique for solving the problem. This auxiliary pattern may be referred to as sub-resolution assist features (SRAF).

Japanese Patent Laid-Open No. 2004-221594 discloses a technology for deriving an insertion position of the auxiliary pattern by a numeric calculation. According to the technology, a position where mutual interferences occur on the mask and a position where interferences are mutually cancelled are obtained by the numeric calculation, and an interference map is derived. Then, an auxiliary pattern with which a phase of light that has passed through a main pattern to be transferred to a substrate (such as a wafer) and a phase of light that has passed through the auxiliary pattern with respect to the main pattern are equal to each other is inserted at the position where the interferences occur on the interference map. As a result, the light that has passed through the main pattern and the light that has passed through the auxiliary pattern strongly interfere with each other.

On the other hand, in a partial coherent image formation in an exposure apparatus, a coherence is obtained from information of an effective light source distribution on a pupil plane of a projection optical system, and it is possible to calculate an aerial image from the coherence and a spectrum distribution of the mask pattern (diffraction light distribution). Herein, the coherence refers to a degree of an interference between certain two points on the mask plane. The coherence is represented by a transmission cross coefficient (TCC). The TCC is defined by the pupil plane of the projection optical system and corresponds to the effective light source distribution, a pupil function in the projection optical system, and an overlapped part of complex conjugate numbers of the pupil function in the projection optical system.

According to Japanese Patent Laid-Open No. 2008-040470, the positions of the pupil function in the projection optical system and the effective light source distribution are fixed, and only the positions of the complex conjugate numbers of the pupil function in the projection optical system are set to be two-dimensionally variable to obtain a two-dimensional TCC, so that an approximate aerial image with respect to the main pattern is calculated by using the two-dimensional TCC. Then, the auxiliary pattern is inserted in the vicinity of a peak position of the approximate aerial image.

The interference map described in Japanese Patent Laid-Open No. 2004-221594 and also the approximate aerial image described in Japanese Patent Laid-Open No. 2008-040470 illustrate positions indicating how much the light from the position where the auxiliary pattern exists interferes with the light from the main pattern to intensify and weaken the image of the main pattern. However, these pieces are not data directly indicating how much values image characteristics of the main pattern (for example, a focus depth of the image, a contrast of the image, an ILS of the image, and the like) become in accordance with the position of the auxiliary pattern. The above-described characteristics represent characteristics of the image of the pattern formed on the substrate while the pattern on the mask is illuminated, and the image of the pattern is projected on the subject via the projection optical system to expose the substrate.

For that reason, according to the technologies disclosed in Japanese Patent Laid-Open No. 2004-221594 and Japanese Patent Laid-Open No. 2008-040470, it is difficult to discriminate the values of the image characteristics of the main pattern in accordance with the position of the auxiliary pattern, and the image of the main pattern may not be formed with respect to a target pattern on the substrate at a sufficient accuracy in some cases.

SUMMARY OF THE INVENTION

A method for generating a pattern of a mask used for an exposure apparatus that exposes a substrate with light by using a projection optical system that projects an image of the pattern of the mask on the substrate through a calculation by a processor according to an aspect of the present invention includes the steps executed by the processor: applying, to a target main pattern, a reference map of a characteristic value of an image of a representative main pattern with respect to a position of a representative auxiliary pattern calculated for each of a plurality of positions while the position of the representative auxiliary pattern with respect to the representative main pattern is changed and calculating a map of the characteristic value of the image of the target main pattern with respect to a position of an auxiliary pattern, and determining the position of the auxiliary pattern by using data of the map of the characteristic value of the image of the target main pattern and generating a pattern of a mask including the target main pattern and the determined auxiliary pattern.

Further features of the present invention will become apparent from the following description of exemplary embodiments with reference to the attached drawings.

BRIEF DESCRIPTION OF THE DRAWINGS

FIGS. 11A and 11B illustrate a representative main figure and a representative SRAF figure according to a fifth exemplary embodiment.

DESCRIPTION OF THE EMBODIMENTS

First Exemplary Embodiment Mode

The present exemplary embodiment mode relates to a lithography technology for fabricating a semiconductor device and relates to a generation of a pattern of a mask used for an exposure apparatus configured to expose a substrate with light by using an illumination optical system for illuminating the mask and a projection optical system for projecting an image of the pattern of the mask on the substrate.

The generation of the mask pattern is executed while a processing unit (a CPU, an MPU, a DSP, an FPGA, or the like) of a computer reads out a program. Software or a program for realizing a function of the present exemplary embodiment mode is supplied to an information processing apparatus constituted by a single or a plurality of computers via a network or various types of storage media. The program is executed while the processing unit of the information processing apparatus reads out the program recorded or stored in a recording medium or the storage medium. Various processings of the program may be executed while a plurality of computers located at separate places mutually transmit and receive data via a wired or wireless communication.

The generation of the mask pattern is performed with regard to a main pattern serving as a pattern of a mask corresponding to a target pattern that is to be formed on a substrate (wafer or the like). The information processing apparatus (computer) assists an image dissection of the main pattern and determines a position of the auxiliary pattern that is not subjected to image dissection, so that data of a pattern of a mask including the main pattern and the thus determined auxiliary pattern is generated.

First, the computer obtains a reference map of a characteristic value of an image of a representative main pattern with respect to a position of a representative auxiliary pattern calculated for each of a plurality of positions while a position of the representative auxiliary pattern with respect to the representative main pattern is changed. Then, the obtained reference map is applied to a target main pattern to calculate a map of a characteristic value of the image of the main pattern with respect to a position of an auxiliary pattern. Subsequently, the position of the auxiliary pattern is determined by using data of the map of the characteristic value of the image of the main pattern, and a pattern of a mask including the main pattern and the determined auxiliary pattern is generated.

Hereinafter, exemplary embodiments of the present invention will be described in detail with reference to the accompanying drawings.

First Exemplary Embodiment

Figure 1:
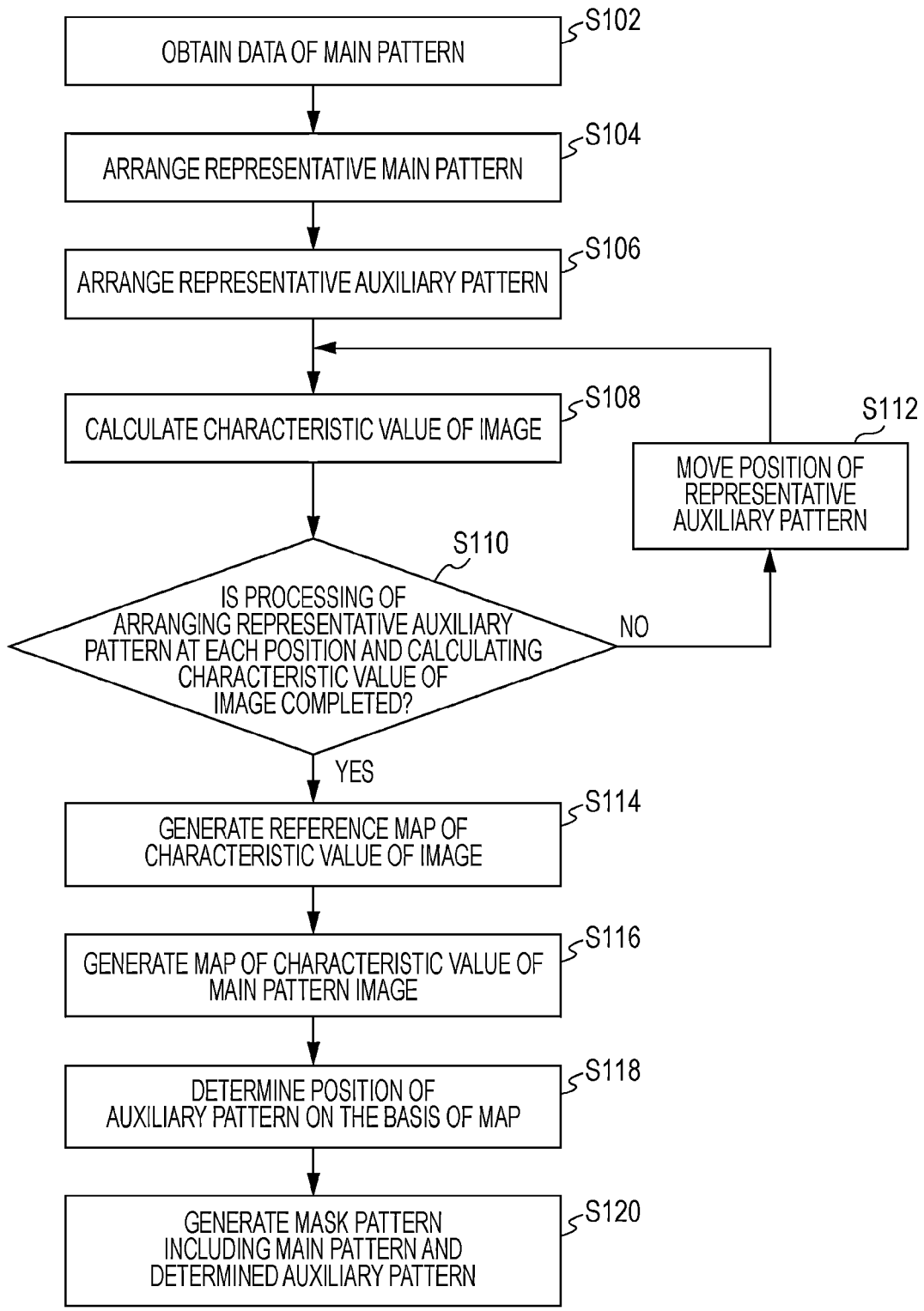
FIG. 1 is a flow chart for generating a mask pattern.

FIG. 1 is a flow chart for generating (creating) a mask pattern according to the present exemplary embodiment.

First, in S102, the processing unit of the computer obtains data of a main pattern serving as a pattern of a mask corresponding to a target pattern that is to be formed on a substrate (wafer or the like). The data may be obtained from data input to a data input apparatus by a user or may be obtained from an external computer or recording medium. The data may be stored in a storage unit (memory) of a computer and obtained each time by reading the data from the storage unit.

Figure 2:
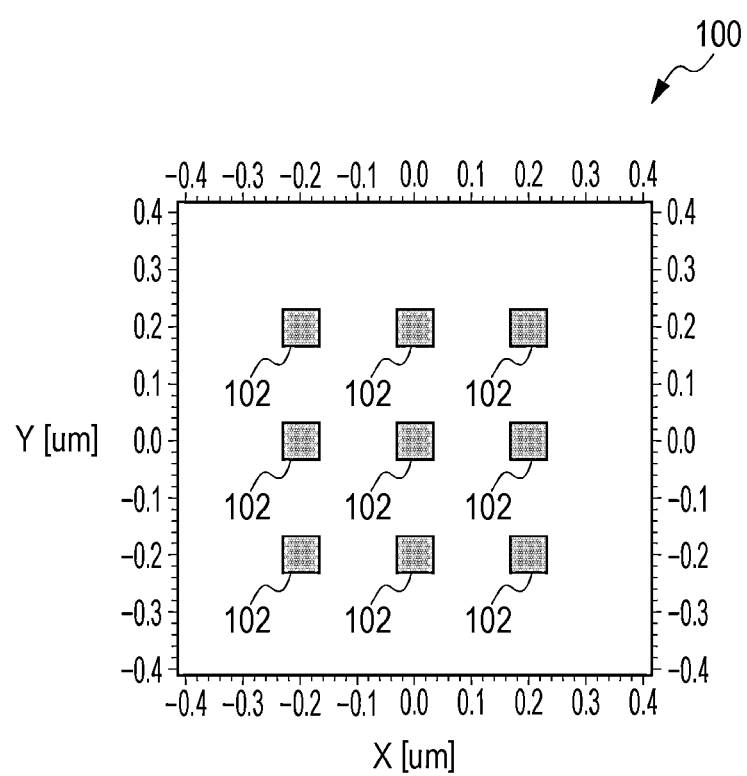
FIG. 2 illustrates a main pattern.

A main pattern 100 illustrated in FIG. 2 is used according to the present exemplary embodiment. Nine pieces of main figures 102 with a shape of a square having a side length of 66 nm are arranged in three columns and three rows at a space of 132 nm. A size of the actual mask figure is, for example, four times as large as a size on an image plane while a projection magnification of an projection exposure apparatus is taken into account, but for a simplification of the description, a dimension of a mask plane (object plane in the projection optical system) is represented while being replaced by a dimension on a substrate plane (image plane in the projection optical system). Therefore, the above-described numeric value of 66 nm is the dimension on the image plane, and the dimension on the actual mask is, for example, 264 nm obtained by multiplying 66 nm by 4. In the case of the present exemplary embodiment, an inner part of the main figure 102 with the square shape is a light transmitting part, and a background (background part) outside the main figure 102 is a light shielding part.

Figure 3A:
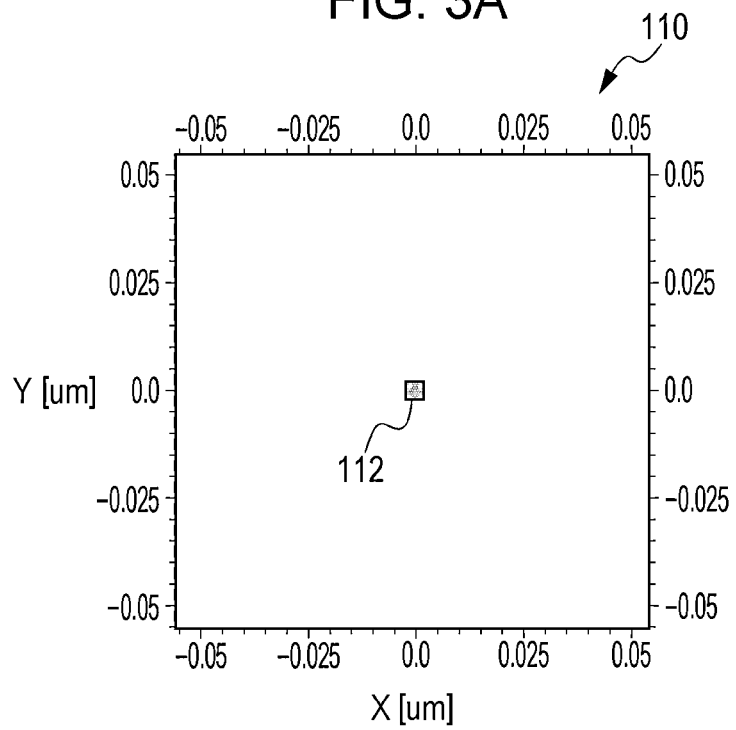
FIGS. 3A and 3B illustrate a representative main figure and a representative SRAF figure according to a first exemplary embodiment.

Next, in S104, to calculate a reference map of the characteristic value of the image, a representative main figure 112 (representative main pattern) representing the main pattern 100 is arranged on the mask plane in terms of a calculation by the computer. The representative main pattern is a representative pattern that simply represents a feature such as a dimension, a shape, or the like of the respective figures of the main pattern 100. According to the present exemplary embodiment, one representative main figure 112 illustrated in FIG. 3A is arranged. The representative main figure 112 is a figure having a same square shape as the shape of the main figure 102, and a length of a side is 4.4 nm. It is however noted that since the resolution of the object plane and the image plane is 4.4 nm in terms of the calculation by the computer according to the present exemplary embodiment, the representative main figure 112 is synonymous with a single point in terms of the calculation.

Figure 3B:
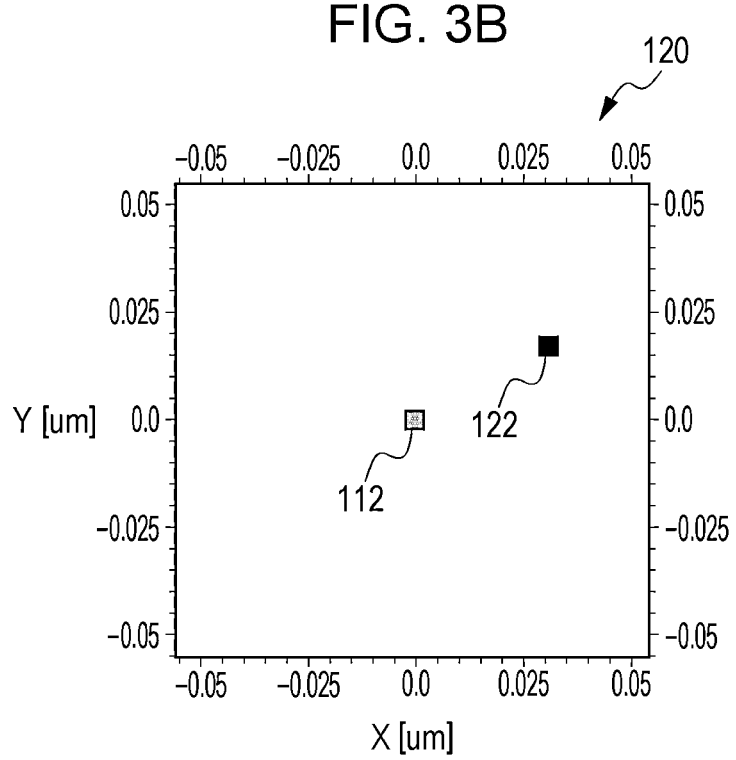

Next, in S106, a representative SRAF figure (representative auxiliary pattern) 122 is arranged at an arbitrary position in a surrounding of the representative main figure 112 on the mask plane in terms of the calculation by the computer. FIG. 3B illustrates the arranged single representative main figure 112 and the single representative SRAF figure 122. According to the present exemplary embodiment, the size of the representative SRAF figure 122 is set as the square having the side of 4.4 nm but is not limited to this. The size of the representative SRAF figure 122 is preferably similar to or smaller than or equal to a size of the SRAF that is supposed to be actually arranged on the mask, and the shape is also preferably similar to the shape of the SRAF. The representative auxiliary pattern is a representative pattern that simply represents a feature such as a dimension, a shape, or the like of the SRAF that is supposed to be actually arranged on the mask.

In S108, a lithography simulation is performed with respect to a first mask pattern including only the representative main figure 112 arranged in S104 and a second mask pattern including the representative main figure 112 and the representative SRAF figure 122 arranged in S106. In the lithography simulation, the pattern on the mask is illuminated for projecting the image of the pattern on the substrate via the projection optical system to expose the substrate with the light, and the image of the pattern that may be formed on the substrate is calculated, so that a value of a characteristic (lithographic characteristic) of the image is obtained. For the calculation of the image, it is possible to use a related art calculation method such as an Abbe's imaging theory or a method of using a transmission cross coefficient (TCC). The image characteristic represents a characteristic of the image of the pattern formed on the substrate when the pattern on the mask is illuminated for projecting the image of the pattern on the substrate via the projection optical system to expose the substrate with the like. According to the present exemplary embodiment, the focus depth is calculated as the image characteristic for a purpose of increasing the focus depth. As conditions for the lithography simulation, the exposure light is set as light from an ArF excimer laser (wavelength at 193 nm), NA of the projection optical system is set as 1.35, and the effective light source distribution is set as an annular illumination having σ of 0.80 to 0.95. σ represents a ratio of the size of the effective light source distribution formed on the pupil plane of the projection optical system with respect to the size of the pupil plane of the projection optical system.

First, an image intensity (exposure amount) level at which the width (dimension) of the image of the representative main figure 112 becomes 66 nm that is the same as the size of the main figure 102 in a state in which no defocus exists in a first mask pattern 110 including only the representative main figure 112 on the mask plane is calculated. It is however noted that the width of the image of the representative main figure 112 is set to have the same size as the main figure 102. The width may be different from the size of the main figure 102 but is preferably close to the size of the main figure 102. Subsequently, a width $W_{0x}$ in an x direction and a width $W_{0y}$ in a y direction of the image of the representative main figure 112 are calculated at the image intensity level in a state in which a 50-nm defocus occurs. Perpendicular directions with respect to an optical axis of the projection optical system are set as x and y directions. Next, an image intensity level at which the width of the image of the representative main figure 112 becomes 66 nm that is the same as the size of the main figure 102 in a state in which no defocus exists in a second mask pattern 120 including the representative main figure 112 and the representative SRAF figure 122 on the mask plane is calculated. Subsequently, a width $W_{kx}$ in the x direction and a width $W_{ky}$ in the y direction of the image of the representative main figure 112 are calculated at the image intensity level, in a state in which a 50-nm defocus occurs. Then, the obtained widths are assigned to an expression $P1=(W_{kx}-W_{0x})+(W_{ky}-W_{0y})$ to calculate a characteristic value P1 related to the focus depth of the image of the representative main figure 112. The value P1 indicates how much the width of the image of the representative main pattern is increased or decreased as compared with a case in which the auxiliary pattern does not exist in a state in which the defocus occurs. When the value of P1 is high, the focus depth is large, so that the value P1 and the focus depth have a correlation.

In the case of the present exemplary embodiment, the size of the representative main figure 112 is the same as the size of the representative SRAF figure 122. For that reason, in a case where without the representative SRAF figure is also subjected to the image dissection at the same time as the representative main figure if the setting remains as it is or a case where the representative main figure is close to the representative SRAF figure, a distortion of the image of the representative main figure is large, and the width of the image of the representative main figure may not be obtained correctly in some cases. This program can be solved by adjusting an amplitude transmittance of the representative SRAF figure or the representative main figure. In the case of the present exemplary embodiment, the amplitude transmittance of the representative SRAF figure is set as ⅙ of the amplitude transmittance of the representative main figure, and the image intensity of the representative SRAF figure is set to be sufficiently small with respect to the image intensity of the representative main figure. The mask according to the present exemplary embodiment is a dark field where a transmittance of the background part is low. In contrast, even in a case where the mask is a bright field, the program can be solved by setting the amplitude transmittance of the representative SRAF figure between the amplitude transmittance of the representative main figure and the amplitude transmittance of the background.

Next, in S110, it is determined whether or not the processing of arranging the representative SRAF figure 122 and calculating the characteristic value P1 of the image with respect to each of all the positions where an auxiliary pattern may be arranged is completed in the setting area in the surrounding of the representative main figure 112.

The surrounding setting area is set as a square area having sides of approximately 870 nm in height and width while the representative main figure 112 is set as a center according to the present exemplary embodiment. This area is divided into grids at approximately 4.4 nm in height and width, and the characteristic value P1 of the image is obtained at each grid (each position). If the characteristic value P1 of the image is not obtained for all the grids in this setting area, the flow progresses to S112, and if the characteristic value P1 of the image is obtained for all the grids, the flow progresses to S114.

In S112, the representative SRAF figure 122 is moved to a position where the processing of arranging the representative SRAF figure 122 and calculating the characteristic value P1 of the image is not performed and arranged in the setting area. Then, in S108, the characteristic value P1 of the image of the representative main figure 112 is obtained for the mask pattern including the representative SRAF figure 122 the position of which is moved and the representative main figure 112.

In this manner, S108, S110, and S112 are repeatedly performed, so that in the setting area in the surrounding of the representative main figure 112, the processing of calculating the characteristic value P1 of the image of the representative main figure 112 with regard to each of the plurality of positions while the position of the representative SRAF figure 122 is changed is performed.

Figure 4A:
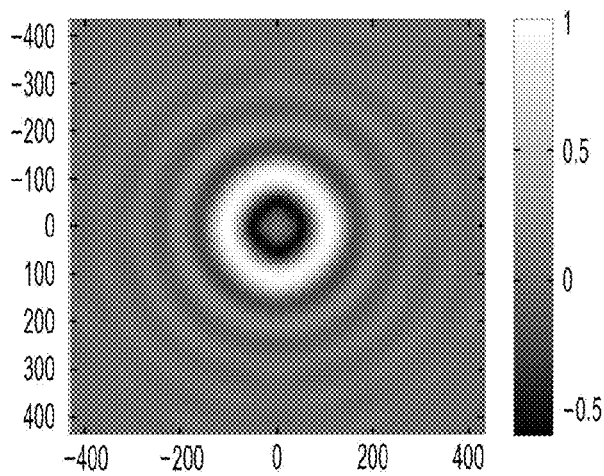
FIGS. 4A, 4B, and 4C illustrate a reference map, an image characteristic value map of the main pattern, and a generated mask pattern.

Next, in S114, a reference map of the characteristic value P1 of the image of the representative main figure 112 with respect to the position of the representative SRAF figure 122 calculated with regard to each of the plurality of positions while the position of the representative SRAF figure 122 is changed is generated (created). The reference map is a map referred to in S116 which will be described below and applied to the main pattern 100 to be subjected to a convolution integration with the main pattern 100. FIG. 4A illustrates the generated reference map according to the present exemplary embodiment. A matrix having 197 rows and 197 columns to which the characteristic value P1 of the image of the representative main figure 112 calculated with respect to each position of the representative SRAF figure 122 is input is generated as the reference map.

Figure 4B:
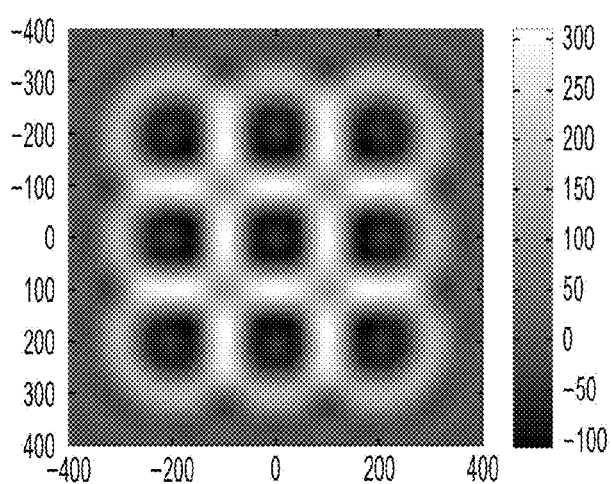

Since the width of the image of the representative main figure 112 is decreased when the defocus occurs in the mask pattern including the representative auxiliary pattern, the focus depth is improved when P1 is a positive value, and the focus depth is deteriorated when P1 is a negative value. To elaborate, whether the characteristic of the image of the representative main figure 112 is improved or deteriorated can be found out from a sign of the characteristic value P1 of the image. For that reason, at a satisfactory accuracy, it is possible to determine the position of the auxiliary pattern for forming the main pattern on the substrate at a sufficient accuracy by evaluating the value of the characteristic value P1. In addition, an advantage is attained in that a calculation amount of the calculation for the characteristic value P1 of the image is small. The characteristic value of the image is not limited to P1, and a value of the focus depth itself may also be calculated. In S116, a convolution integration (convolution) is performed by using the obtained reference map and the main pattern 100 obtained in S102, and a characteristic value map of the image of the main pattern 100 (image characteristic sensitivity map) is generated. To elaborate, the convolution integration of the map illustrated in FIG. 4A and the pattern illustrated in FIG. 2 is performed. FIG. 4B illustrates the generated image characteristic sensitivity map.

Next, in S118, the position of the SRAF (auxiliary pattern) is determined on the basis of the image characteristic sensitivity map. The focus depth is improved when the SRAF is arranged at a position where the value of the image characteristic sensitivity map illustrated in FIG. 4B is positive on the basis of the definition of the characteristic value P1 of the image. In view of the above, according to the present exemplary embodiment, an SRAF 132 (auxiliary pattern) is arranged at a position where the value of the image characteristic sensitivity map is positive and a relatively large local maximum value.

Figure 4C:
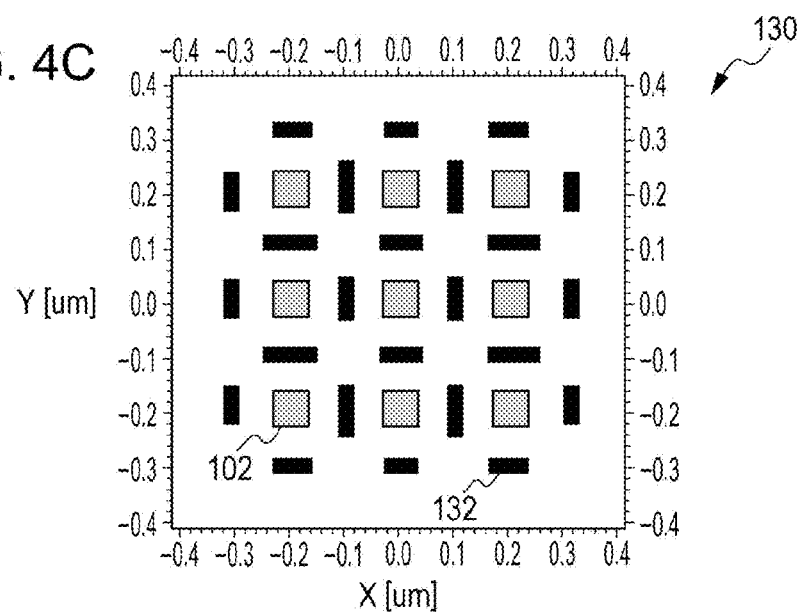

Next, in S120, a mask pattern including the main pattern 100 and the auxiliary pattern the position of which is determined in S118 is generated. FIG. 4C illustrates a mask pattern 130 obtained by arranging the SRAF 132 in the main pattern 100 illustrated in FIG. 2. The SRAF 132 is set as a rectangular having a width on one side is 22 nm.

To check an effect of the arranged SRAF 132, the focus depth of the image of the main pattern 100 is checked in a case where the SRAF 132 is arranged in the main pattern 100 and a case where the SRAF 132 is not arranged. Before the focus depth is checked, an optical proximity correction (OPC) is performed in both the case where the SRAF 132 is arranged and the case where the SRAF 132 is not arranged. Specifically, the positions and the lengths of the respective sides of the main figure 102 are adjusted so that the width of the image of the respective main figures 102 becomes 66 nm in a state in which no defocus exists. Then, the positions where the focus depth is checked are the widths in the x directions and the y directions of the respective nine main figures 102, and a defocus range where an error with respect to the target width (66 nm) is within 10% is checked, so that the common focus depth is checked. The focus depth in a case where the SRAF 132 is not inserted is 73 nm, and the focus depth in a case where the SRAF 132 is inserted is 84 nm. According to the present exemplary embodiment, it may be understood that the focus depth of the image of the main pattern is increased.

Therefore, according to the present exemplary embodiment, it is possible to generate the pattern of the mask with which the image of the main pattern can be formed on the substrate at a sufficient accuracy.

Figure 5:
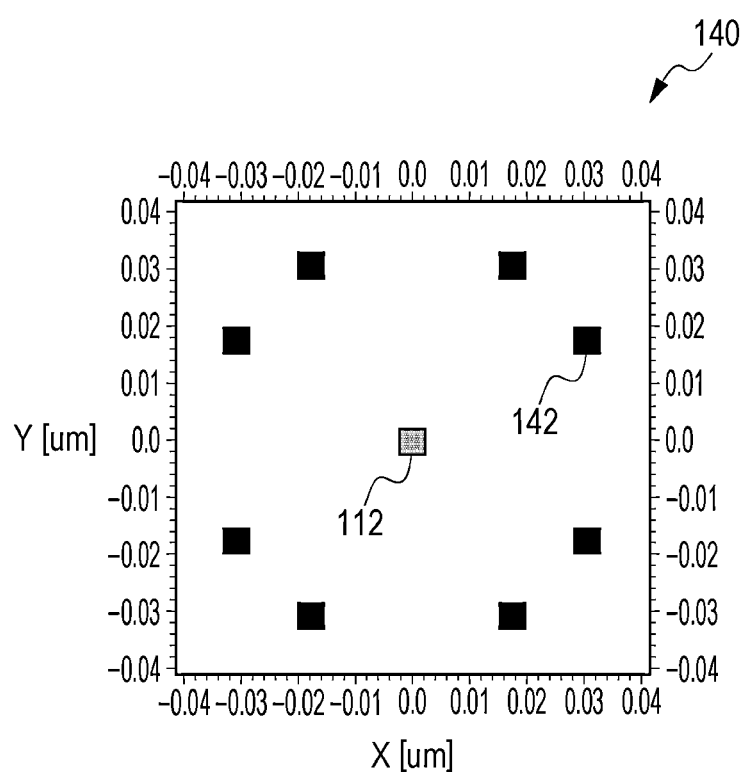
FIG. 5 illustrates a modified example of the SRAF figure according to the first exemplary embodiment.

According to the present exemplary embodiment, only one representative SRAF figure is arranged in S106, but the number of the representative SRAF figure is not limited to one. In the case of the present exemplary embodiment, since the mask pattern and the effective light source distribution are symmetrical to each other with respect to straight lines x=0, y=0, y=x, and y=−x, a pattern 140 obtained by arranging eight representative SRAF figures 142 in a symmetrical manner as illustrated in FIG. 5 may be used.

Second Exemplary Embodiment

A second exemplary embodiment is different from the first exemplary embodiment in that the mask pattern is a rectangular instead of the square. While a description of a part overlapping with the first exemplary embodiment is omitted, the second exemplary embodiment will be described with reference to the flow chart of FIG. 1.

Figure 6A:
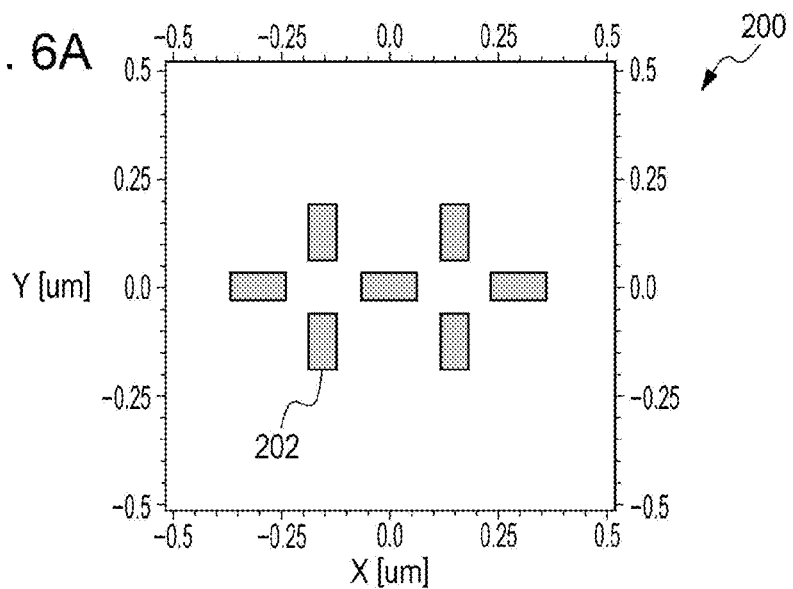
FIGS. 6A, 6B, and 6C illustrate a main pattern, an image characteristic value map of the main pattern, and a generated mask pattern according to a second exemplary embodiment.

First, data of a main pattern is obtained in S102. According to the present exemplary embodiment, a main pattern 200 illustrated in FIG. 6A is used. Seven main figure 202 with a rectangular shave having side lengths of 128 nm×66 nm are arranged. According to the present exemplary embodiment, S104 and S106 are the same as the first exemplary embodiment, so that the description thereof will be omitted.

S108 according to the present exemplary embodiment is also similar to the first exemplary embodiment. It is however noted that in S108, an image intensity level at which the width of the image of the representative main figure 112 becomes 66 nm that is the same as the short side of the main figure 202 in a state in which no defocus exists with respect to the mask pattern including only the representative main figure 112 is calculated. According to the present exemplary embodiment, the width of the image of the representative main figure 112 is set to be the same as the length of the short side of the main figure 202 but may be different from the length. The width is preferably between the length of the long side and the length of the short side and is preferably close to the length of the side where the image characteristic is stricter. Then, the width $W_{0x}$ in the x direction and the width $W_{0y}$ in the y direction of the image when the 50-nm defocus occurs at the image intensity level are calculated. The procedures after $W_{0x}$ and $W_{0y}$ are calculated are the same as the first exemplary embodiment, and the description thereof will be omitted.

S110 to S114 are the same as the first exemplary embodiment, so that the description thereof will be omitted. The reference map obtained in S114 is similar to the first exemplary embodiment and is the reference map illustrated in FIG. 4A.

Figure 6B:
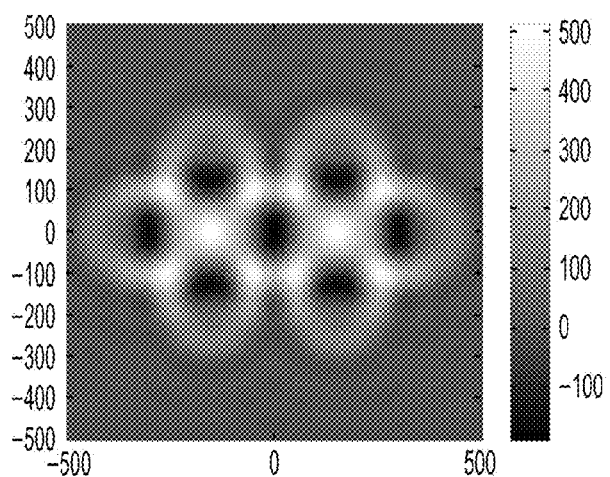

Next, in S116, a convolution integration (convolution) is performed by using the reference map obtained in S114 and the main pattern 200 obtained in S102, and a characteristic value map (image characteristic sensitivity map) of the image of the main pattern 200 is generated. To elaborate, a convolution integration of the map of FIG. 4A and the pattern of FIG. 6A is performed. FIG. 6B illustrates the generated image characteristic sensitivity map.

Next, in S118, the position of the SRAF (auxiliary pattern) is determined on the basis of the image characteristic sensitivity map. When the SRAF is arranged at a part where the value of the image characteristic sensitivity map illustrated in FIG. 6B is positive, the focus depth is improved on the basis of the definition of the image characteristic value P1. In view of the above, according to the present exemplary embodiment, an SRAF 232 is arranged at a position where the value of the image characteristic sensitivity map is positive and a relatively large local maximum value.

Figure 6C:
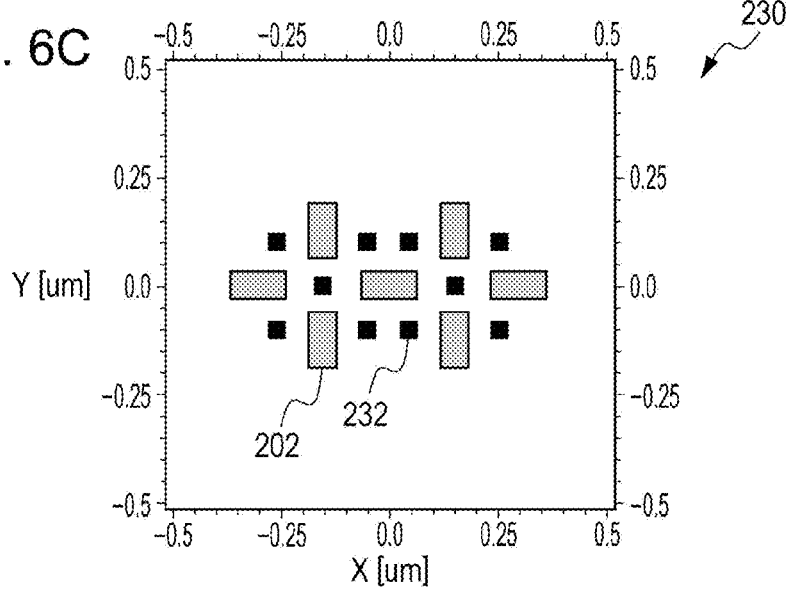

Next, in S120, a mask pattern including the main pattern 200 and the SRAF 232 the position of which is determined in S118 is generated. FIG. 6C illustrates a mask pattern 230 obtained by arranging the SRAF 232 in the main pattern 200 illustrated in FIG. 6A. The SRAF 232 is set as a square having a side length of 40 nm.

To check an effect of the arranged the SRAF 232, the focus depth of the image of the main pattern 200 is checked in a case where the SRAF 232 is arranged in the main pattern 200 and a case where the SRAF 232 is not arranged. The OPC is performed with respect to both the cases where the SRAF 232 is arranged and where the SRAF 232 is not arranged before the focus depth is checked. Specifically, the positions and the lengths of the respective sides of the main figure 202 are adjusted so that the width in the long side direction of the images of the respective main figures 202 becomes 128 nm and the width in the short side direction becomes 66 nm in a state in which no defocus exists. Then, the positions where the focus depth is checked are the widths in the x directions and the y directions of the respective seven rectangular main figures 202, and a defocus range where an error with respect to the target width (128 nm×66 nm) is within 10% is checked, so that the common focus depth is checked. The focus depth in a case where the SRAF 232 is not inserted is 74 nm, and the focus depth in a case where the SRAF 232 is inserted is 82 nm. According to the present exemplary embodiment, it may be understood that the focus depth of the image of the main pattern is increased.

In this manner, the configuration is effective even in a case where the main figure is not a square. Similarly, the configuration is also effective in a case where the main pattern is composed of a plurality of main figures having different shapes.

Therefore, according to the present exemplary embodiment, it is possible to generate the pattern of the mask with which the image of the main pattern can be formed on the substrate at a sufficient accuracy.

Third Exemplary Embodiment

The above-described exemplary embodiment is aimed at increasing the focus depth, but the present exemplary embodiment is aimed at widening a process window. While a description of an overlapping part of the above-described exemplary embodiment is omitted, the third exemplary embodiment will be described by referring to the flow chart of FIGS. 1.

S102 to S106 are the same as the second exemplary embodiment, so that the description thereof will be omitted.

In S108, the calculation for the image intensity distribution is performed by the lithography simulation, and the value of the wanted image characteristic is obtained. For the simulation conditions, the exposure light is set as light from an ArF excimer laser (wavelength at 193 nm), NA of the projection optical system is set as 1.35, and the effective light source shape is set as a quadrupole illumination shape.

To widen the process window according to the present exemplary embodiment, a value of the image characteristic that will be described below is calculated. First, an image intensity (exposure amount) level at which the width of the image of the representative main figure 112 becomes 66 nm that is the same as the short side of the main figure 202 in a state in which no defocus exists with respect to the mask pattern including only the representative main figure 112 is calculated. Then, a width $W_{0x2}$ in the x direction and a width $W_{0y2}$ in the y direction of the image when the 50-nm defocus occurs at an image intensity level that is 1.05 times as high as the calculated image intensity level are calculated. Next, an image intensity level at which the width of the image of the representative main figure 112 becomes 66 nm that is the same as the mask pattern including only the representative main figure 112 in a state in which no defocus exists with respect to the mask pattern including the representative main figure 112 and the representative SRAF figure 122 is calculated. Then, at the 1.05-fold image intensity level, a width $W_{kx2}$ in the x direction and a width $W_{ky2}$ in the y direction of the image when the 50-nm defocus occurs are calculated. According to the present exemplary embodiment too, similarly as in the first exemplary embodiment, the amplification transmittance of the mask figure is adjusted. Then, the image characteristic value P2 is calculated by assigning the thus calculated widths of the image to an expression $P2=(W_{kx2}-W_{0x2})+(W_{ky2}-W_{0y2})$.

Since the width of the image of the main figure 202 used according to the present exemplary embodiment is decreased in the case of defocus, and also the width is further decreased when the image intensity level is multiplied by 1.05, the process window is improved when the image characteristic value P2 is a positive value, and the process window is deteriorated when the image characteristic value P2 is a negative value. A feature is attained that the image characteristic value P2 used according to the present exemplary embodiment has a small calculation amount, and also, whether the image characteristic is improved or deteriorated can be found out by a sign of the image characteristic value P2, so that it is facilitated to evaluate the image characteristic value P2 when the position of the SRAF is determined. A size of a range of the process window itself may also be used for the image characteristic value.

S110 and S112 are the same as the first exemplary embodiment, so that the description thereof will be omitted.

Figure 7A:
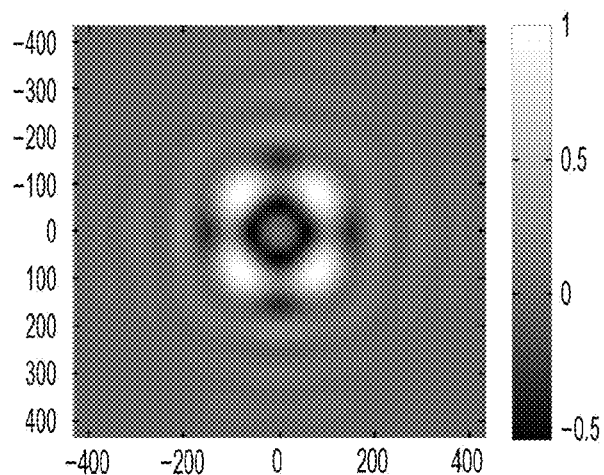
FIGS. 7A, 7B, and 7C illustrate a reference map, an image characteristic value map of the main pattern, and a generated mask pattern according to a third exemplary embodiment.

In S114, a reference map of the image characteristic value P2 is generated by using the image characteristic value P2 obtained by the repeated calculations in S108 to S112. A matrix in which the image characteristic value is input to an element corresponding to each position where the representative SRAF figure 122 is arranged is generate as the reference map. According to the present exemplary embodiment, FIG. 7A illustrates the matrix that has 197 rows and 197 columns.

Figure 7B:
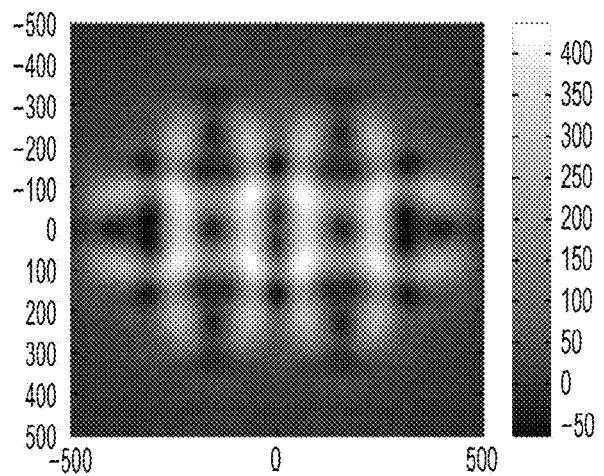

Next, in S116, a convolution integration (convolution) is performed by using the obtained reference map and the main pattern 200 obtained in S102, and a map (image characteristic sensitivity map) of the characteristic value P2 of the image of the main pattern 200 is generated. To elaborate, a convolution integration of the map of FIG. 7A and the pattern of FIG. 6A is performed. FIG. 7B illustrates the generated image characteristic sensitivity map.

Next, in S118, the position of the SRAF (auxiliary pattern) is determined on the basis of the image characteristic sensitivity map. When the SRAF is arranged at a position where the value of the image characteristic sensitivity map illustrated in FIG. 7B is positive, the process window is improved on the basis of the definition of the image characteristic value P2. In view of the above, according to the present exemplary embodiment, an SRAF 332 is arranged at a position where the value of the image characteristic sensitivity map is positive and a relatively large local maximum value.

Figure 7C:
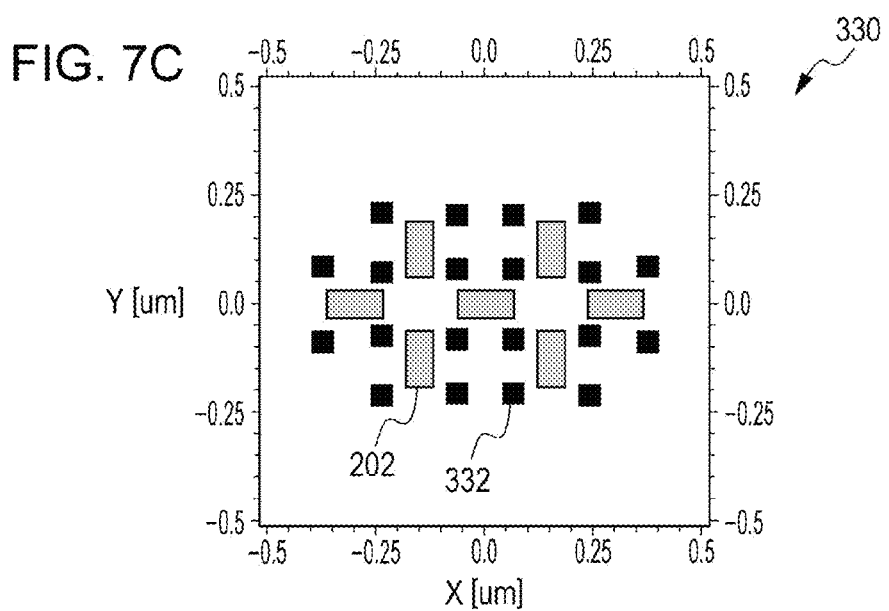

Next, in S120, the mask pattern including the main pattern 200 and the SRAF 332 the position of which is determined in S118 is generated. FIG. 7C illustrates the mask pattern 330 obtained by arranging the SRAF 332 in the main pattern 200 illustrated in FIG. 7A. The SRAF 332 is set as a square having a side length of 44 nm.

To check an effect of the arranged SRAF 332, the process window of the image of the main pattern 200 is checked in a case where the SRAF 332 is arranged in the main pattern 200 and a case where the SRAF 332 is not arranged. The OPC is performed with respect to both the cases where the SRAF 332 is arranged and where the SRAF 332 is not arranged before the process window is checked. Specifically, the positions and the lengths of the respective sides of the main figure 202 are adjusted so that the width in the long side direction of the images of the respective main figures 202 becomes 128 nm, and the width in the short side direction becomes 66 nm in a state in which no defocus exists. Then, the positions where the process window is checked are the widths in the x directions and the y directions of the respective seven rectangular main figures 202, and the target width is set as 128 nm×66 nm. An image intensity distribution is calculated by the lithography simulation while the defocus amount is changed, and a size of an exposure margin when an error allowable value for the width of the image of the main figure 202 is set as 10% is obtained with respect to each defocus amount. Then, a common focus range where the size of the exposure margin is higher than or equal to 5% is set as the process window.

The process window is 67 nm in a case where the SRAF 332 is not inserted, and the process window is 92 nm in a case where the SRAF 332 is inserted. According to the present exemplary embodiment, it may be understood that the process window of the image of the main pattern is increased.

Therefore, according to the present exemplary embodiment, it is possible to generate the pattern of the mask with which the image of the main pattern can be formed on the substrate at a sufficient accuracy.

Second Exemplary Embodiment Mode

According to the present exemplary embodiment mode, S116 in the flow chart according to the first exemplary embodiment mode is different. According to the present exemplary embodiment mode, in S116, the procedure of reducing the respective figures included in the main pattern and the procedure of performing a convolution integration (convolution) by using the generated reference map of the image characteristic and the reduced main pattern and generating the image characteristic sensitivity map of the main pattern are prepared.

Hereinafter, an exemplary embodiment of the present invention will be described in detail on the basis of the accompanying drawings.

Fourth Exemplary Embodiment

A fourth exemplary embodiment of the present invention will be described by using the flow chart of FIG. 2.

Figure 8A:
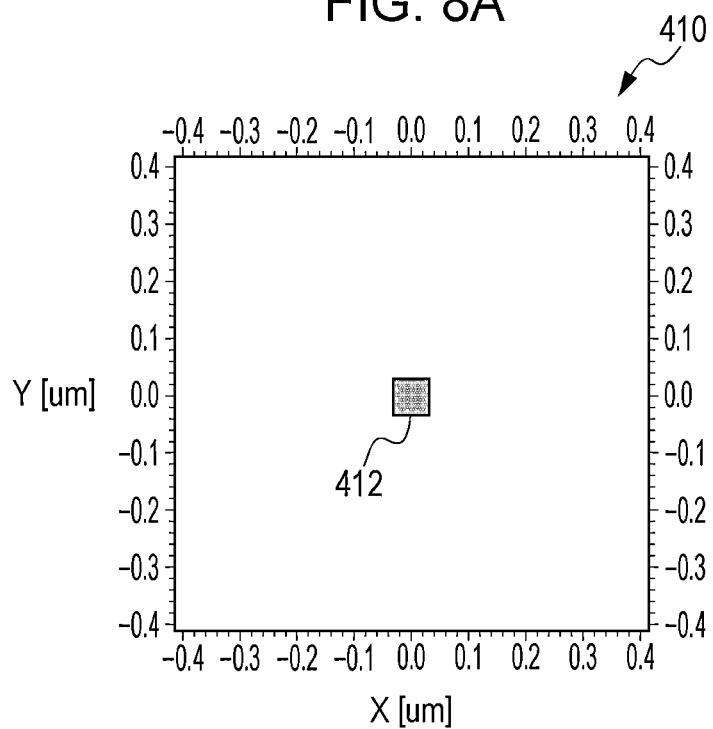
FIGS. 8A and 8B illustrate a representative main figure and a representative SRAF figure according to a fourth exemplary embodiment.

In 102, data of the main pattern 100 illustrated in FIG. 2 is obtained. Next, in S104, a representative main figure 412 (representative main pattern) is arranged on the mask plane in terms of the calculation by the computer. According to the present exemplary embodiment, the single representative main figure 412 illustrated in FIG. 8A. The representative main figure 412 is equivalent to the single main figure 102 and has a square shape with a side length of 66 nm. A size of the representative main figure 412 is preferably close to the actual main figure 102. In a case where variations exist in the shape and the size of the main figures 102, the shape and the size of the representative main figure 412 are preferably averaged shape and size of the actual main figures 102. The average mentioned herein may be an average value among all the figures or an average value of a maximum value and a minimum value.

Figure 8B:
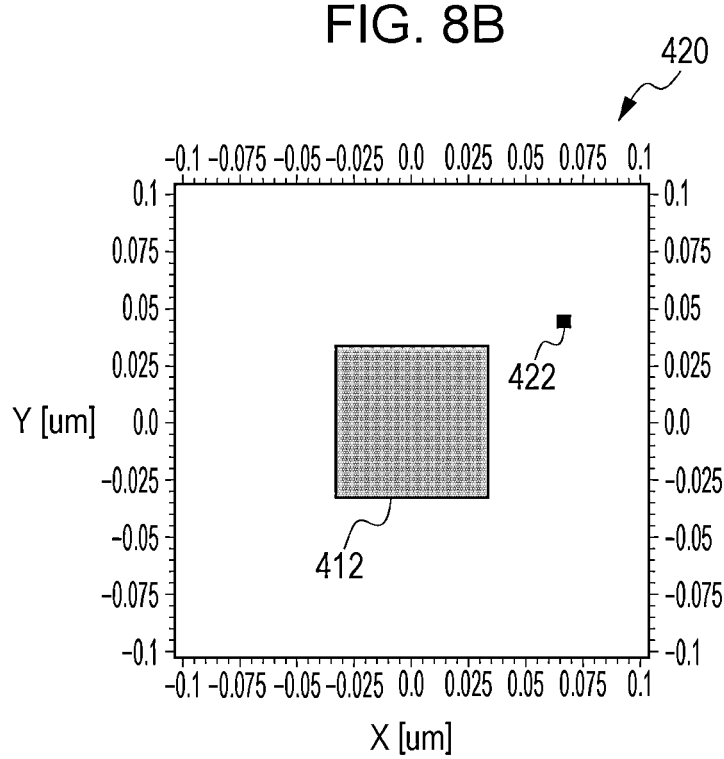

Next, in S106, a representative SRAF figure (representative auxiliary pattern) 422 is arranged at an arbitrary position in the surrounding of the representative main figure 412 on the mask plane in terms of the calculation by the computer. FIG. 8B illustrates a pattern 420 including the arranged single representative main figure 412 and the single representative SRAF figure 422. FIG. 8B illustrates expanded ranges of axes of FIG. 8A. According to the present exemplary embodiment, a size of the representative SRAF figure 422 is set as a square having a side length of 4.4 nm but is not limited to this. The size is preferably equal to, or smaller than, a size of the SRAF that is to be actually arranged on the mask.

Next, in S108, the lithography simulation is performed to calculate an image intensity distribution on an image plane, and a value of the wanted image characteristic is obtained. The simulation conditions are also similar to those according to the first exemplary embodiment. For a purpose of increasing the focus depth, the value P1 obtained in a similar method to the first exemplary embodiment is set as the value of the image characteristic according to the present exemplary embodiment. First, an image intensity level at which the width of the image of the representative main figure 412 becomes 66 nm that is the same as the size of the main figure 102 in a state in which no defocus exists with respect to a mask pattern 410 including only the representative main figure 412 is calculated. Then, the width $W_{0x}$ in the x direction and the width $W_{0y}$ in the y direction of the image when the 50-nm defocus occurs at the image intensity level are calculated. Next, an image intensity level at which the width of the image of the representative main figure 412 becomes 66 nm that is the same as the main figure 102 in a state in which no defocus exists with respect to the mask pattern 420 including the representative main figure 412 and the representative SRAF figure 422 on the mask plane is calculated. Then, at the image intensity level, the width $W_{kx}$ in the x direction and the width $W_{ky}$ in the y direction of the image when the 50-nm defocus occurs are calculated.

In the case of the present exemplary embodiment, since the size of the representative SRAF figure 422 is extremely small with respect to the representative main figure 412, a change in the width of the image of the representative main figure 412 depending on the presence or absence of the representative SRAF figure 422 becomes small if the setting remains as it is, and a calculation accuracy may be decreased. This problem can be solved by adjusting the representative SRAF figure or the amplitude transmittance of the representative main figure. In the case of the present exemplary embodiment, the amplification transmittance of the representative SRAF figure 422 is set as 25 times as high as that of the representative main figure 412. Of course, the size of the representative SRAF figure 422 may also be increased.

The next S110 and S112 are the same as the first exemplary embodiment, so that the description thereof will be omitted.

Figure 9A:
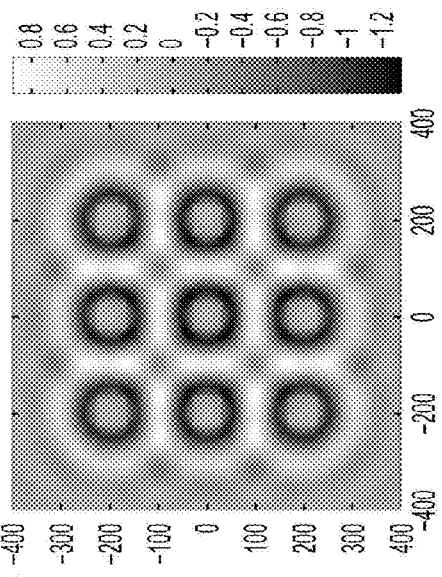
FIGS. 9A, 9B, 9C, and 9D illustrate a reference map, a reduced main pattern, an image characteristic map of the main pattern, and a generated mask pattern the fourth exemplary embodiment.

In S114, a reference map of the characteristic value P1 of the image is generated. FIG. 9A illustrates the reference map according to the present exemplary embodiment.

Figure 9B:
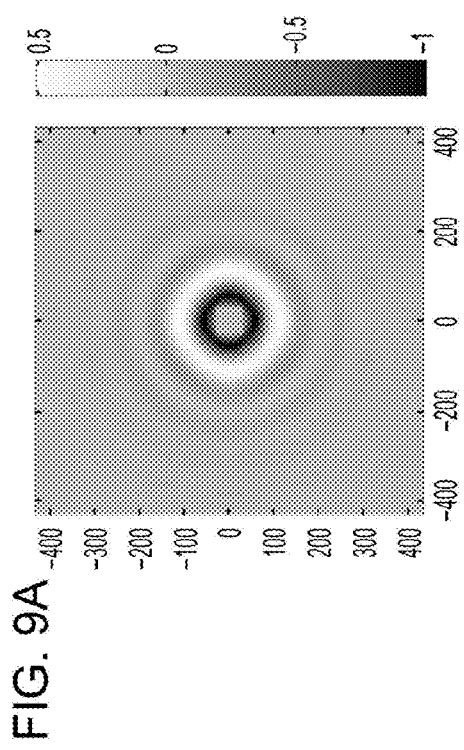
Figure 9C:
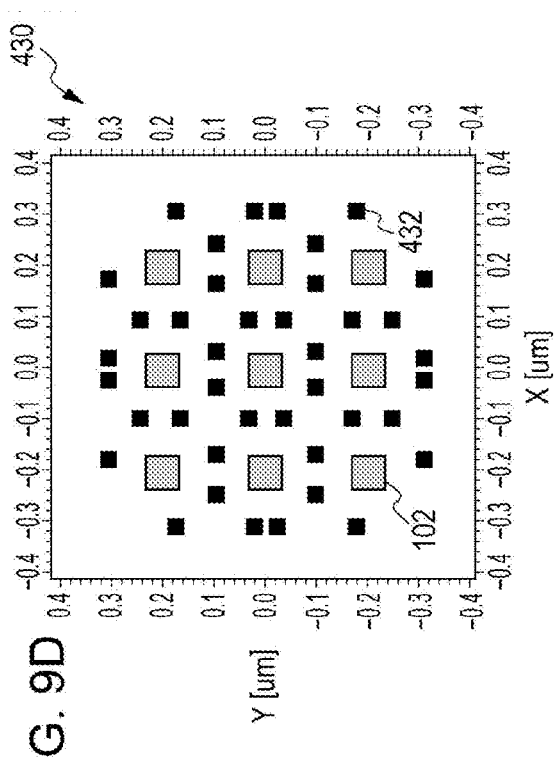

Next, in S116, the respective main figures 102 included in the main pattern 100 are reduced. FIG. 9B illustrates a main pattern 450 that is in a reduced state. Main figures 452 are figures obtained by reducing the respective main figures 102. In the case of the present exemplary embodiment, since a size of the reduced main figure 452 is a square having 4.4 nm in height and width, and an object plane of the lithography simulation and a resolution of an image plane is 4.4 nm, the reduced main figure 452 is synonymous with a single point in terms of the simulation. Next, a convolution integration (convolution) is performed by using the generated reference map of the image characteristic and the reduced main pattern 450, and the image characteristic sensitivity map of the main pattern 450 is generated. To elaborate, the convolution integration of the map of FIG. 9A and the pattern of FIG. 9B is performed. FIG. 9C illustrates the generated image characteristic sensitivity map.

Next, in S118, the position of the SRAF (auxiliary pattern) is determined on the basis of the image characteristic sensitivity map. When the SRAF is arranged at the position where the value of the image characteristic sensitivity map illustrated in FIG. 9C is positive, the focus depth is improved on the basis of the definition of the image characteristic value P1. In view of the above, according to the present exemplary embodiment, an SRAF 432 is arranged at a position where the value of the image characteristic sensitivity map is positive and a relatively large local maximum value.

Figure 9D:
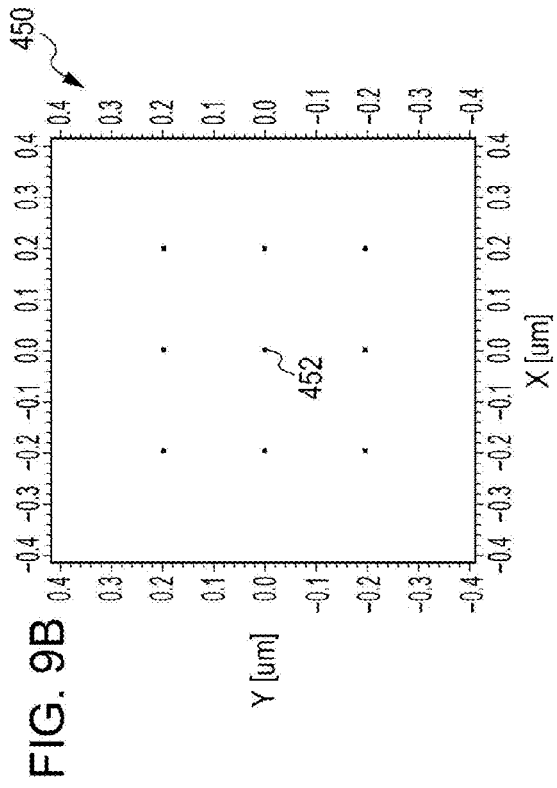

Next, in S120, the mask pattern including the main pattern 100 and the auxiliary pattern the position of which is determined in S118 is generated. FIG. 9D illustrates a mask pattern 430 obtained by arranging the SRAF 432 on the main pattern 100. The SRAF 432 is set as a square having a side length of 31 nm.

To check an effect of the arranged SRAF 432, the focus depth of the image of the main pattern 100 is checked in a case where the SRAF 432 is arranged in the main pattern 100 and a case where the SRAF 432 is not arranged. The OPC is performed with respect to both the cases where the SRAF 432 is arranged and where the SRAF 432 is not arranged before the focus depth is checked. Specifically, the positions and the lengths of the respective sides of the main figure 102 are adjusted so that the width of the image of the respective main figures 102 becomes 66 nm in a state in which no defocus exists. Then, the positions where the focus depth is checked are widths in the x directions and the y directions of the respective nine main figures 102, and a defocus range where an error with respect to the target width (66 nm) is within 10% is checked, so that the common focus depth is checked. The focus depth is 73 nm in a case where the SRAF 432 is not inserted, and the focus depth is 83 nm in a case where the SRAF 432 is inserted. According to the present exemplary embodiment, it may be understood that the focus depth of the image of the main pattern is increased.

Therefore, according to the present exemplary embodiment, it is possible to generate the pattern of the mask with which the image of the main pattern can be formed on the substrate at a sufficient accuracy.

Figure 10:
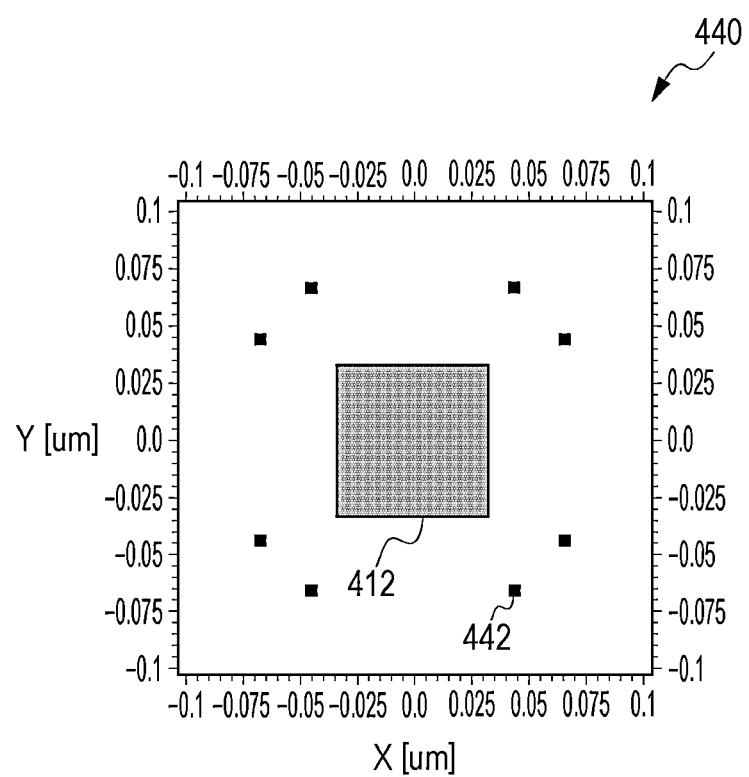
FIG. 10 illustrates a modified example of the SRAF figure according to the fourth exemplary embodiment.

According to the present exemplary embodiment, only one representative SRAF figure is arranged in S106, but the number of the representative SRAF figure is not limited to one. In the case of the present exemplary embodiment, since the mask pattern and the effective light source distribution are symmetrical with each other with respect to the straight lines x=0, y=0, y=x, and y=−x, a pattern 440 obtained by arranging eight representative SRAF figures 442 in a symmetrical manner as illustrated in FIG. 10 may be used.

Fifth Exemplary Embodiment

According to a fifth exemplary embodiment, it is aimed to decrease a mask error enhancement factor (MEEF). A description of a part overlapping with the fourth exemplary embodiment will be omitted.

The main pattern 100 illustrated in FIG. 2 is used also according to the present exemplary embodiment. In S104, a representative main figure 512 is arranged on the mask plane in terms of the calculation by the computer. According to the present exemplary embodiment, the single representative main figure 512 illustrated in FIG. 11A is arranged. The representative main figure 512 is set as a square figure having a side length of 66 nm.

Next, in S106, on the mask plane in terms of the calculation by the computer, a representative SRAF figure (representative auxiliary pattern) 522 is arranged at an arbitrary position in the surrounding of the representative main figure 512. FIG. 11B illustrates the arranged single representative main figure 512 and the single representative SRAF figure 522. FIG. 11B illustrates expanded ranges of axes of FIG. 11A. A size of the representative SRAF figure 522 is preferably close to an SRAF figure actually formed on the mask. According to the present exemplary embodiment, a size of the representative SRAF figure 522 is set as a square having a side length of 31 nm.

Next, in S108, the lithography simulation is performed to calculate an image intensity distribution on an image plane, and a value of the wanted image characteristic is obtained. With regard to the simulation conditions, the exposure light is set as light from an ArF excimer laser (wavelength at 193 nm), NA of the projection optical system is set as 1.35, and the effective light source shape is set as a small σ illumination shape having σ at 0.3.

Since the present exemplary embodiment aims at reducing the MEEF, a value of an image characteristic which will be described below is calculated. First, an image intensity level at which a width of the image of the representative main figure 512 becomes 66 nm that is the same as the size of the main figure 102 with respect to a mask pattern 510 including only the representative main figure 512 is calculated. Next, four sides of the representative main figure 512 are respectively moved towards an outer side by 1 nm to enlarge the representative main figure 512, and a width $W_{0x3}$ in the x direction and a width $W_{0y3}$ in the y direction of the image of the representative main figure 512 at the above-described image intensity level are calculated. Next, an image intensity level at which a width of the image of the representative main figure 512 becomes 66 nm that is the same as the representative main figure 512 with respect to a mask pattern 520 including the representative main figure 512 and the representative SRAF figure 522 on the mask plane is calculated. Next, the respective sides of the representative main figure 512 and the representative SRAF figure 522 are moved towards the outer side by 1 nm to enlarge the figures, and a width $W_{kx3}$ in the x direction and a width $W_{ky3}$ in the y direction of the image of the thus calculated image intensity level are calculated. Then, the thus calculated widths of the images are assigned to an expression $P3=(W_{kx3}-W_{0x3})+(W_{ky3}-W_{0y3})$, so that the image characteristic value P3 is calculated.

When the figure of the pattern is enlarged, the width of the image is also increased. Thus, when P3 is a negative value, the MEEF is improved, and when P3 is a positive value, the MEEF is deteriorated. Whether the image characteristic is improved or deteriorated can be found out by a sign of the image characteristic value P3 used according to the present exemplary embodiment, and a feature exists that so that it is facilitated to evaluate the image characteristic value P3 when the position of the SRAF is determined. An MEEF value itself may also be used for the value of the image characteristic.

The next S110 and S112 are the same as the fourth exemplary embodiment, so that the description thereof will be omitted.

Figure 12A:
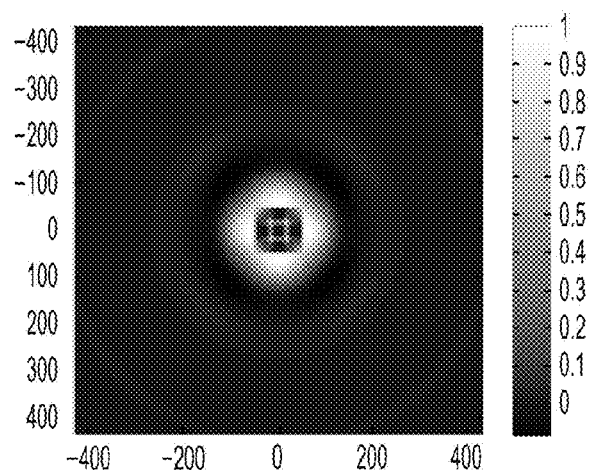
FIGS. 12A, 12B, and 12C illustrate a reference map, an image characteristic value map of the main pattern, and a generated mask pattern according to the fifth exemplary embodiment.

In S114, a reference map of the image characteristic value P3 is generated by using the image characteristic value P3 obtained by the above-described repeated calculations. This is a matrix in which the value of the image characteristic of the representative main figure 512 is input while corresponding to the positions where the representative SRAF figures 522 are sequentially arranged. According to the present exemplary embodiment, FIG. 12A illustrates the matrix that has 197 rows and 197 columns.

Figure 12B:
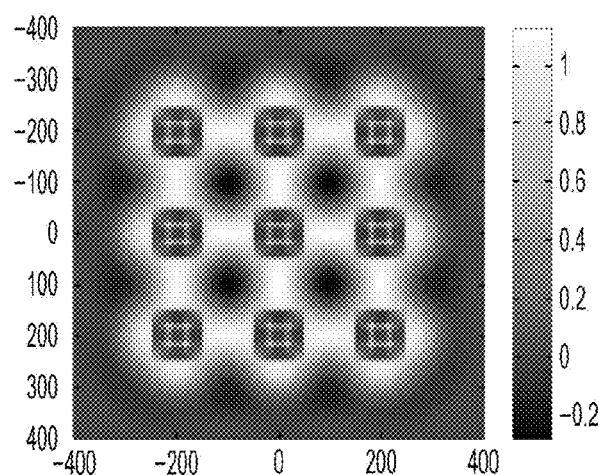

Next, in S116, the respective main figures 102 included in the main pattern 100 are reduced. This procedure is similar to the fourth exemplary embodiment. Next, a convolution integration (convolution) is performed by using the generated reference map of the image characteristic value P3 and the reduced main pattern the main pattern 450, and the image characteristic sensitivity map of the main pattern 450 is generated. To elaborate, the convolution integration of the map of FIG. 12A and the pattern of FIG. 9B is performed. FIG. 12B illustrates the generated image characteristic sensitivity map.

Next, in S118, the position of the SRAF (auxiliary pattern) is determined on the basis of the image characteristic sensitivity map. When the SRAF is arranged at a part where the value of the image characteristic sensitivity map illustrated in FIG. 12B is negative, the MEEF is improved on the basis of a definition of the image characteristic value P3. In view of the above, according to the present exemplary embodiment, SRAFs figures 532 and 533 are arranged at positions where the value of the image characteristic sensitivity map is negative and a relatively large local maximum value.

Figure 12C:
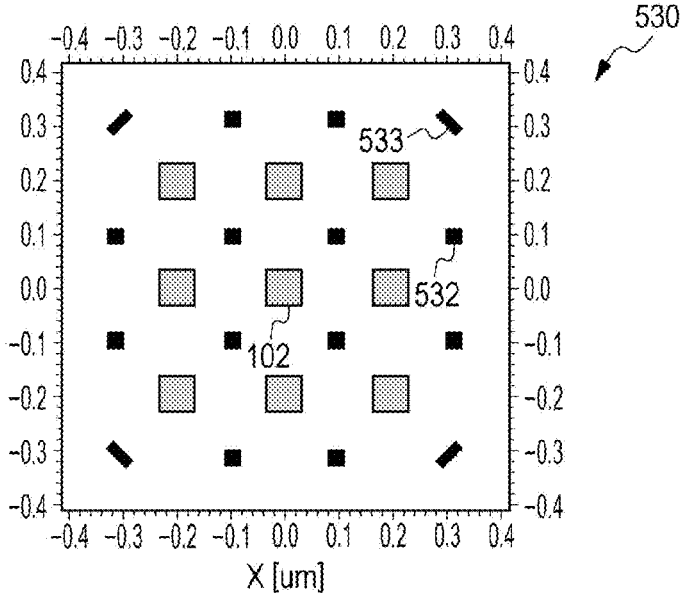

Next, in S120, the mask pattern including the main pattern 100 and the auxiliary pattern the position of which is determined in S118 is generated. FIG. 12C illustrates a mask pattern 530 obtained by arranging the SRAF figures 532 and 533 in the main pattern 100. The SRAF figure 532 is set as a square having a side length of 31 nm, and the SRAF figure 533 is set as a rectangular where a length of the short side is 19 nm, and a length of the long side is 50 nm.

To check an effect of the arranged SRAFs 532 and 533, the MEEF of the main pattern 100 is checked in a case where the SRAFs 532 and 533 are arranged in the main pattern 100 and a case where the SRAFs 532 and 533 are not arranged. The OPC is performed with respect to both the cases where the SRAFs are arranged and where the SRAFs are not arranged before the MEEF is checked. Specifically, in a state in which no defocus exists, the positions and the lengths of the respective sides of the main figure 102 are adjusted so that the width of the image of the respective main figures 102 becomes 66 nm. The positions where the MEEF is checked are the width in the x direction and the width in the y direction of the respective nine main figures 102. A maximum MEEF is 2.7 in a case where the SRAFs are not inserted, and the maximum MEEF is 2.6 in a case where the SRAFs are inserted. According to the present exemplary embodiment, it may be understood that the MEEF of the main pattern is decreased.

Therefore, according to the present exemplary embodiment, it is possible to generate the pattern of the mask with which the image of the main pattern can be formed on the substrate at a sufficient accuracy.

The image characteristic is not limited to the image characteristic according to the above-described exemplary embodiment but may be an index representing a characteristic of the image of the pattern formed on the substrate when the pattern on the mask is illuminated for projecting the image of the pattern on the substrate via the projection optical system to expose the substrate with the light. The configuration can be applied to various image characteristics such as an image contrast, an image intensity log slope (ILS), an image normalized ILS (NILS), a degree of freedom for an exposure, and a PV band as the image characteristic. In addition, combination of those can also be used. Herein, the PV band is a process variation band and indicates a variation range of an edge of the image when a focus control accuracy, an exposure amount control accuracy, and a mask drawing precision have finite values.

In addition, according to the above-described exemplary embodiment, the characteristic of the image on the image plane, to elaborate, a characteristic value of a latent image formed on a resist that is coated on the substrate is calculated by the lithography simulation. However, the characteristic is not limited to this, and any image characteristic representing an accuracy of the image of the pattern formed on the substrate may be used. For example, a characteristic of a resist image obtained by developing the latent image formed on the resist that is coated on the substrate or a characteristic of a process image formed on the substrate that is formed after predetermined process processing such as etching may be obtained, and the obtained characteristic may be used.

Third Exemplary Embodiment Mode

The data of the mask pattern generated according to the above-described exemplary embodiment is input to a mask manufacturing apparatus (pattern drawing apparatus), and the apparatus manufactures a mask by drawing a pattern on mask blanks on the basis of the input data. Then, previously set exposure conditions are set in an exposure apparatus. The manufactured mask is illuminated, and the image of the mask pattern is projected on a photosensitizing agent (resist) on the substrate to expose the photosensitizing agent with the light.

Next, a method of manufacturing a device (such as a semiconductor IC element or a liquid crystal display element) using the above-described exposure apparatus will be described. The device is manufactured by exposing a substrate (such as a wafer or a glass substrate) with light on which a photosensitizing agent is coated by using the manufactured mask and the exposure apparatus, developing the substrate (photosensitizing agent), and performing other related art processing. The other related art processing includes etching, resist removing, dicing, bonding, packaging, or the like. According to the present device manufacturing method, it is possible to manufacture a higher quality device as compared with a related art technique.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-123218, filed Jun. 11, 2013, which is hereby incorporated by reference herein in its entirety.

What is claimed is:

1. A method for generating a pattern of a mask to be used for a mask manufacturing method for manufacturing the mask using data of the generated pattern of the mask for an exposure apparatus that exposes a substrate with light by using a projection optical system that projects an image of the pattern of the mask on the substrate, the method comprising the steps executed by a processor of:
  applying, to a target main pattern, a reference map of a characteristic value of an image of a representative main pattern with respect to a position of a representative auxiliary pattern and calculating a map of the characteristic value of the image of the target main pattern with respect to a position of an auxiliary pattern; and
  determining the position of the auxiliary pattern by using data of the map of the characteristic value of the image of the target main pattern and generating a pattern of a mask including the target main pattern and the determined auxiliary pattern,
  wherein the auxiliary pattern is for the main pattern and is not resolved,
  wherein the characteristic value of the reference map at any one position is a characteristic value of an image of the representative main pattern projected on an image plane when the representative auxiliary pattern arranged at the one position and the representative main pattern exist on an object plane, and the reference map has the characteristic values of the image of the representative main pattern, the characteristic values being obtained while a position of the representative auxiliary pattern is changed around the representative main pattern on the object plane, and
  wherein the mask manufacturing method comprises a step of manufacturing the mask including the generated pattern using data of the generated pattern.

2. The method according to claim 1, further comprising:
  calculating a first image of the representative main pattern when only the representative main pattern and the representative auxiliary pattern exist on the object plane; and
  calculating second images of the representative main pattern projected on the image plane when the representative main pattern and the representative auxiliary pattern exist on the object plane while the position of the representative auxiliary pattern is changed,
  wherein the reference map is obtained by using the first image and the second image.

3. The method according to claim 1, wherein the characteristic value of the image indicates at least one of values including a focus depth, a contrast, an intensity log slope (ILS), a normalized ILS (NILS), a degree of freedom for an exposure, a process window, a mask error enhancement factor (MEEF), and a process variation (PV) band.

4. The method according to claim 1, wherein a convolution integration of the reference map where the representative main pattern is calculated as a point and the target main pattern having a dimension larger than the point is performed to obtain the map of the characteristic value of the image of the target main pattern.

5. The method according to claim 1, wherein a convolution integration of the reference map where the representative main pattern is calculated to have a dimension larger than a point and the target main pattern set as the point is performed to obtain the map of the characteristic value of the image of the target main pattern.

6. The method according to claim 1, wherein an amplitude transmittance of the representative auxiliary pattern is between an amplitude transmittance of the representative main pattern and an amplitude transmittance of a background of the mask.

7. A mask manufacturing method comprising:
  generating data of a pattern of a mask by using a method comprising:
    applying, to a target main pattern, a reference map of a characteristic value of an image of a representative main pattern with respect to a position of a representative auxiliary pattern and calculating a map of the characteristic value of the image of the target main pattern with respect to a position of an auxiliary pattern; and
    determining the position of the auxiliary pattern by using data of the map of the characteristic value of the image of the target main pattern and generating a pattern of a mask including the target main pattern and the determined auxiliary pattern,
    wherein the auxiliary pattern is for the main pattern and is not resolved,
    wherein the characteristic value of the reference map at any one position is a characteristic value, of an image of the representative main pattern projected on an image plane, of when the representative auxiliary pattern arranged at the one position and the representative main pattern exist on an object plane, and the reference map has the characteristic values of the image of the representative main pattern projected on the image plane, the characteristic values being obtained while a position of the representative auxiliary pattern is changed around the representative main pattern on the object plane, and
    wherein the mask manufacturing method comprises a step of manufacturing the mask including the generated pattern using data of the generated pattern; and
  manufacturing the mask by using the generated data of the pattern of the mask.

8. An exposure method comprising:
  manufacturing a mask by using a mask manufacturing method comprising:
    generating data of a pattern of a mask by using a method, the method comprising:
      applying, to a target main pattern, a reference map of a characteristic value of an image of a representative main pattern with respect to a position of a representative auxiliary pattern and calculating a map of the characteristic value of the image of the target main pattern with respect to a position of an auxiliary pattern; and determining the position of the auxiliary pattern by using data of the map of the characteristic value of the image of the target main pattern and generating a pattern of a mask including the target main pattern and the determined auxiliary pattern, wherein the auxiliary pattern is for the main pattern and is not resolved, wherein the characteristic value of the reference map at any one position is a characteristic value, of an image of the representative main pattern projected on an image plane, of when the representative auxiliary pattern arranged at the one position and the representative main pattern exist on an object plane, and the reference map has the characteristic values of the image of the representative main pattern projected on the image plane, the characteristic values being obtained while a position of the representative auxiliary pattern is changed around the representative main pattern on the object plane, and wherein the mask manufacturing method comprises a step of manufacturing the mask including the generated pattern using data of the generated pattern; and manufacturing the mask by using the generated data of the pattern of the mask; and exposing a substrate with light by using the manufactured mask.

9. A device manufacturing method comprising:
exposing a substrate with light by using an exposure method, the exposure method comprising:
manufacturing a mask by using a mask manufacturing method, the mask manufacturing method comprising generating data of a pattern of a mask by using a method, the method comprising:
applying, to a target main pattern, a reference map of a characteristic value of an image of a representative main pattern with respect to a position of a representative auxiliary pattern and calculating a map of the characteristic value of the image of the target main pattern with respect to a position of an auxiliary pattern; and
determining the position of the auxiliary pattern by using data of the map of the characteristic value of the image of the target main pattern and generating a pattern of a mask including the target main pattern and the determined auxiliary pattern,
wherein the auxiliary pattern is for the main pattern and is not resolved,
wherein the characteristic value of the reference map at any one position is characteristic value, of an image of the representative main pattern projected on an image plane, of when the representative auxiliary pattern arranged at the one position and the representative main pattern exist on an object plane, and the reference map has the characteristic values of the image of the representative main pattern projected on the image plane, the characteristic values being obtained while a position of the representative auxiliary pattern is changed around the representative main pattern on the object plane, and
wherein the mask manufacturing method comprises a step of manufacturing the mask including the generated pattern using data of the generated pattern; and manufacturing the mask by using the generated data of the pattern of the mask; and exposing a substrate with light by using the manufactured mask; and developing the exposed substrate.

10. A non-transitory recording medium that records a program for causing a processor to execute a method comprising:
applying, to a target main pattern, a reference map of a characteristic value of an image of a representative main pattern with respect to a position of a representative auxiliary pattern and calculating a map of the characteristic value of the image of the target main pattern with respect to a position of an auxiliary pattern; and
determining the position of the auxiliary pattern by using data of the map of the characteristic value of the image of the target main pattern and generating a pattern of a mask including the target main pattern and the determined auxiliary pattern,
wherein the auxiliary pattern is for the main pattern and is not resolved,
wherein the characteristic value of the reference map at any one position is a characteristic value, of an image of the representative main pattern projected on an image plane, of when the representative auxiliary pattern arranged at the one position and the representative main pattern exist on an object plane, and the reference map has the characteristic values of the image of the representative main pattern projected on the image plane, the characteristic values being obtained while a position of the representative auxiliary pattern is changed around the representative main pattern on the object plane, and
wherein the mask manufacturing method comprises a step of manufacturing the mask including the generated pattern using data of the generated pattern.

11. An information processing apparatus comprising a processing unit configured to generate a pattern of a mask used for an exposure apparatus that exposes a substrate with light by using a projection optical system that projects an image of the pattern of the mask on the substrate through a calculation,
wherein the processing unit applies, to a target main pattern, a reference map of a characteristic value of an image of a representative main pattern with respect to a position of a representative auxiliary pattern, calculates a map of the characteristic value of the image of the target main pattern with respect to a position of an auxiliary pattern, determines the position of the auxiliary pattern by using data of the map of the characteristic value of the image of the target main pattern, and generates a pattern of a mask including the target main pattern and the determined auxiliary pattern,
wherein the auxiliary pattern is for the main pattern and is not resolved,
wherein the characteristic value of the reference map at any one position is a characteristic value, of an image of the representative main pattern projected on an image plane, of when the representative auxiliary pattern arranged at the one position and the representative main pattern exist on an object plane, and the reference map has the characteristic values of the image of the representative main pattern projected on the image plane, the characteristic values being obtained while a position of the representative auxiliary pattern is changed around the representative main pattern on the object plane, and wherein the mask manufacturing method comprises a step of manufacturing the mask including the generated pattern using data of the generated pattern.

* * * * *